US007692367B2

(12) United States Patent
Hirano et al.

(10) Patent No.: US 7,692,367 B2
(45) Date of Patent: Apr. 6, 2010

(54) ULTRASONIC TRANSDUCER

(75) Inventors: Hiroyuki Hirano, Inba-gun (JP); Takaaki Asada, Moriyama (JP); Mio Furuya, Muko (JP); Junichi Nishie, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/467,361

(22) Filed: May 18, 2009

(65) Prior Publication Data

US 2009/0218913 A1 Sep. 3, 2009

Related U.S. Application Data

(63) Continuation of application No. PCT/JP2007/072634, filed on Nov. 22, 2007.

(30) Foreign Application Priority Data

Nov. 27, 2006 (JP) ............................ 2006-318329

(51) Int. Cl.
*H01L 41/053* (2006.01)

(52) U.S. Cl. ...................................... 310/348; 310/324

(58) Field of Classification Search ................. 310/324, 310/348

See application file for complete search history.

(56) References Cited

U.S. PATENT DOCUMENTS

| | | | | |
|---|---|---|---|---|
| 3,821,834 | A * | 7/1974 | McElroy | 29/25.35 |
| 3,921,016 | A * | 11/1975 | Livermore et al. | 310/324 |
| 6,617,765 | B1 * | 9/2003 | Lagier et al. | 310/330 |
| 2008/0218030 | A1 | 9/2008 | Asada et al. | |

FOREIGN PATENT DOCUMENTS

| | | | |
|---|---|---|---|
| JP | 60-139399 | U | 9/1985 |
| JP | 11-266498 | A | 9/1999 |
| JP | 2001-013239 | A | 1/2001 |
| JP | 2001-078296 | A | 3/2001 |
| JP | 2001-128292 | A | 5/2001 |
| JP | 2004-343660 | A | 12/2004 |
| WO | 2007/029559 | A1 | 3/2007 |
| WO | 2007/069609 | A1 | 6/2007 |
| WO | 2008/047743 | A1 | 4/2008 |

OTHER PUBLICATIONS

Official Communication issued in International Patent Application No. PCT/JP2007/072634, mailed on Feb. 12, 2008.

* cited by examiner

*Primary Examiner*—Thomas M Dougherty
(74) *Attorney, Agent, or Firm*—Keating & Bennett, LLP

(57) ABSTRACT

A piezoelectric device is attached to an inner bottom surface of the outer case having a tubular shape including a bottom, and an inner case is disposed within the outer case. In an ultrasonic vibration acting surface of the inner case that is arranged to face the bottom surface of the outer case, a mass of the inner case is arranged to restrain vibration of the outer case, which is generated by the piezoelectric device. A first cutout is provided in a portion of the ultrasonic vibration acting surface and arranged to face the piezoelectric device so as to flatten an ultrasonic beam generated by vibrations of the piezoelectric device and the outer case. Second cutouts are provided at locations on the ultrasonic vibration acting surface spaced away from the first cutout in a line symmetrical relationship with a long axis of the first cutout defining a symmetrical axis.

7 Claims, 9 Drawing Sheets

ULTRASONIC TRANSDUCER

BACKGROUND OF THE INVENTION

1. Field of the Invention

The present invention relates to an ultrasonic transducer arranged to perform signal conversion between an ultrasonic signal and an electric signal.

2. Description of the Related Art

Japanese Unexamined Patent Application Publication No. 2001-128292 discloses an ultrasonic transducer including a piezoelectric device that is disposed on an inner bottom surface of a tubular outer case and a directivity control member that is disposed inside the outer case.

In the ultrasonic transducer disclosed in Japanese Unexamined Patent Application Publication No. 2001-128292, the directivity control member arranged to control the shape of an ultrasonic beam is in close contact with the inner bottom surface of the outer case to which the piezoelectric device is attached, in order to flatten the ultrasonic beam depending on the intended use of the ultrasonic transducer, e.g., object detection and distance measurement.

The directivity control member is a member including a hole having long axis extending in one of the planar (two-dimensional) directions. By arranging the directivity control member in close contact with the inner bottom surface of the outer case, an effective vibration region of ultrasonic waves is increased in the long-axis direction of the hole of the directivity control member, and the effective vibration region of ultrasonic waves is decreased in the short-axis direction of the hole of the directivity control member, i.e., in a direction substantially perpendicular to the long-axis direction. Furthermore, as a contact area between the bottom surface of the outer case and a surface (hereinafter referred to as an “ultrasonic vibration acting surface”) of the directivity control member arranged to face the inner bottom surface of the outer case increases, a larger mass is applied to a contact portion of the outer case, which restrains vibration of the outer case. Hereinafter, such a mass is referred to as a “restraint mass”. Thus, by configuring the effective vibration region to have different sizes between the long-axis direction and the short-axis direction of the hole of the directivity control member such that the restraint mass applied to the bottom surface of the outer case is increased in portions of the outer case on both sides of the hole along the long axis, the bottom surface of the outer case, which defines a vibrating surface, is subjected to anisotropy between the long-axis direction and the short-axis direction of the hole of the directivity control member. Such a mechanism is effective to flatten the ultrasonic beam.

However, the above-described related art has the following problems. The restraint mass applied from the ultrasonic vibration acting surface of the directivity control member to the bottom surface of the outer case is not rotationally symmetrical with respect to any angle. This implies that the restraint mass contributes to flattening the beam shape, but simultaneously causes large vibrations in a bending mode, i.e., a vibration mode in which the effective vibration region is alternately distorted in the long-axis direction and the short-axis direction. In other words, undesired vibrations, i.e., higher-order spurious vibrations, are generated in addition to the basic vibration. Because the undesired vibrations have frequencies that are close to resonance frequencies of the basic vibration, the undesired vibrations also tend to be excited together with the basic vibration. Consequently, the vibrations in the undesired vibration mode continue to vibrate, which adversely affects a reverberation characteristic.

If the undesired vibration mode continues for an extended period of time, the piezoelectric device continues to generate electric signals with vibrations caused by the reverberation. Therefore, an electric signal generated with the vibration of the piezoelectric device, which is caused by ultrasonic waves reflecting from an obstacle, is obscured in the electric signals generated with the vibrations caused by the reverberation. Accordingly, the ultrasonic waves reflecting from the obstacle cannot be accurately detected.

The generation of the undesired vibrations can be effectively suppressed by coating a damping material, such as a silicone resin or a urethane resin, over the bottom surface of the outer case, which includes the piezoelectric device disposed thereon, other than the effective vibration region. However, in an ultrasonic transducer having such an arrangement, the damping material absorbs not only the undesired vibrations, but also the basic vibration because the damping material is coated near the effective vibration region of the piezoelectric device. This results in a reduction in the sensitivity of the ultrasonic transducer.

SUMMARY OF THE INVENTION

To overcome the problems described above, preferred embodiments of the present invention provide an ultrasonic transducer which prevents undesired vibrations and suppresses reverberation, and which ensures satisfactory basic vibration, in addition to the ultrasonic transducer having a case structure that flattens an ultrasonic beam.

A preferred embodiment of the present invention provides an ultrasonic transducer including an outer case that has tubular shape and a bottom, a piezoelectric device attached to an inner bottom surface of the outer case, an inner case disposed within the outer case and having a surface arranged to face the inner bottom surface of the outer case in order to provide an ultrasonic vibration acting surface in which a mass of the inner case restrains vibration of the outer case, the vibration being generated by the piezoelectric device, and terminals electrically conducted to the piezoelectric device, wherein the inner case has a first cutout provided in a portion of the ultrasonic vibration acting surface, which is arranged to face an attached portion of the piezoelectric device, to flatten an ultrasonic beam generated by vibrations of the piezoelectric device and the outer case, and has a second cutout arranged at a location on the ultrasonic vibration acting surface spaced away from the first cutout, the second cutout preferably having, for example, a notched or an engraved shape.

Herein, the first cutout is a cutout arranged to produce anisotropy between a long-axis direction and a short-axis direction in the ultrasonic vibration acting surface of the inner case, which is arranged to face the inner bottom surface of the outer case, i.e., a vibrating surface thereof, to thereby flatten directivity. For example, the first cutout is preferably a substantially elliptical or substantially rectangular cutout having a long axis extending in one of the planar (two-dimensional) directions. With the first cutout, an aspect ratio of length to width of an effective vibration region of the outer case is increased to be greater than 1.

With such a structure, the beam shape is flattened, for example, such that a horizontal width of the ultrasonic beam and a vertical width of the ultrasonic beam differ from each other. Furthermore, the second cutout is provided at a location that effectively flattens a distribution of mass that functions to restrain the outer case in cooperation with the first cutout. In other words, the mass of the inner case which functions to restrain the outer case is balanced so as to suppress undesired vibrations in the bending mode.

In addition, according to a preferred embodiment of the present invention, the first cutout preferably has a shape with a long axis extending in one direction along the surface of the inner case, which is arranged to face the inner bottom surface of the outer case, for example, and the second cutout preferably includes two aligned symmetrical portions on both sides of the long axis of the first cutout, for example.

With this arrangement, the second cutouts are provided at locations at which a large restraint mass acts on the outer case when the inner case includes only the first cutout. As a result, the mass acting to restrain the outer case is balanced and the undesired vibrations in the bending mode are effectively suppressed.

Further, according to a preferred embodiment of the present invention, the second cutout preferably defines a raised portion around the first cutout, and the second cutout is preferably disposed along substantially an entire surface outside the raised portion, for example.

With such an arrangement, since a contact portion between the inner bottom surface of the outer case and the ultrasonic vibration acting surface of the inner case is minimized, variations in mass balance are effectively prevented. In addition, since the second cutout is arranged to extend to corner (ridge) portions of the inner case, close contact between the ultrasonic vibration acting surface of the inner case and the inner bottom surface of the outer case is prevented from becoming unbalanced even if there are dimensional errors in the inner case and the outer case. Accordingly, vibration in an undesired mode, which may occur due to the lack of the mass balance, is reliably prevented.

According to a preferred embodiment of the present invention, the inner case preferably has a higher medium density than the outer case.

Such a feature is effective to suppress not only the vibration of the bottom surface of the outer case, but also the resonance vibration of a side surface of the outer case. Thus, a reverberation can be more effectively suppressed.

Furthermore, according to a preferred embodiment of the present invention, a space defined by the second cutout of the inner case and the inner bottom surface of the outer case is preferably filled with a filler preferably having a medium density that is less than the medium density of the inner case and of the outer case.

Such a structure more effectively absorbs undesired vibrations of the inner bottom surface, particularly at corner portions thereof, of the outer case and the side surface of the outer case, and more effectively suppresses the undesired vibrations. Additionally, according to a preferred embodiment of the present invention, since the raised portion is provided between the first cutout and the second cutout, the filler defining a damping material does not extend to the effective vibration region of the piezoelectric device and is prevented from adversely affecting the basic vibration in the effective vibration region of the piezoelectric device.

Preferably, a through-hole is arranged to communicate with the second cutout.

With such a structure, the filler can be filled in the space which is defined by the second cutout and the inner bottom surface of the outer case, merely pouring the filler via the through-hole from the interior of the inner case. As a result, the outer case and the inner case can be bonded to each other by the filler. Thus, an adhesive provided only to bond the outer case and the inner case to each other is not required.

Preferably, outer opposite ends of the first cutout in a long-axis direction thereof extend to corresponding edges of the case, and a third cutout is provided in a middle portion of the raised portion in a lengthwise direction thereof.

With such a structure, the directivity can be further improved while the reverberations are effectively suppressed. In other words, the ultrasonic beam can be generated in a further flattened shape.

According to various preferred embodiments of the present invention, an ultrasonic transducer can be obtained which prevents the undesired vibrations and suppresses the reverberation, and which can ensure satisfactory basic vibration, while the ultrasonic transducer has a case structure capable of flattening the ultrasonic beam.

Other features, elements, arrangements, steps, characteristics and advantages of the present invention will become more apparent from the following detailed description of preferred embodiments of the present invention with reference to the attached drawings.

DETAILED DESCRIPTION OF PREFERRED EMBODIMENTS

First Preferred Embodiment

Figure 1:
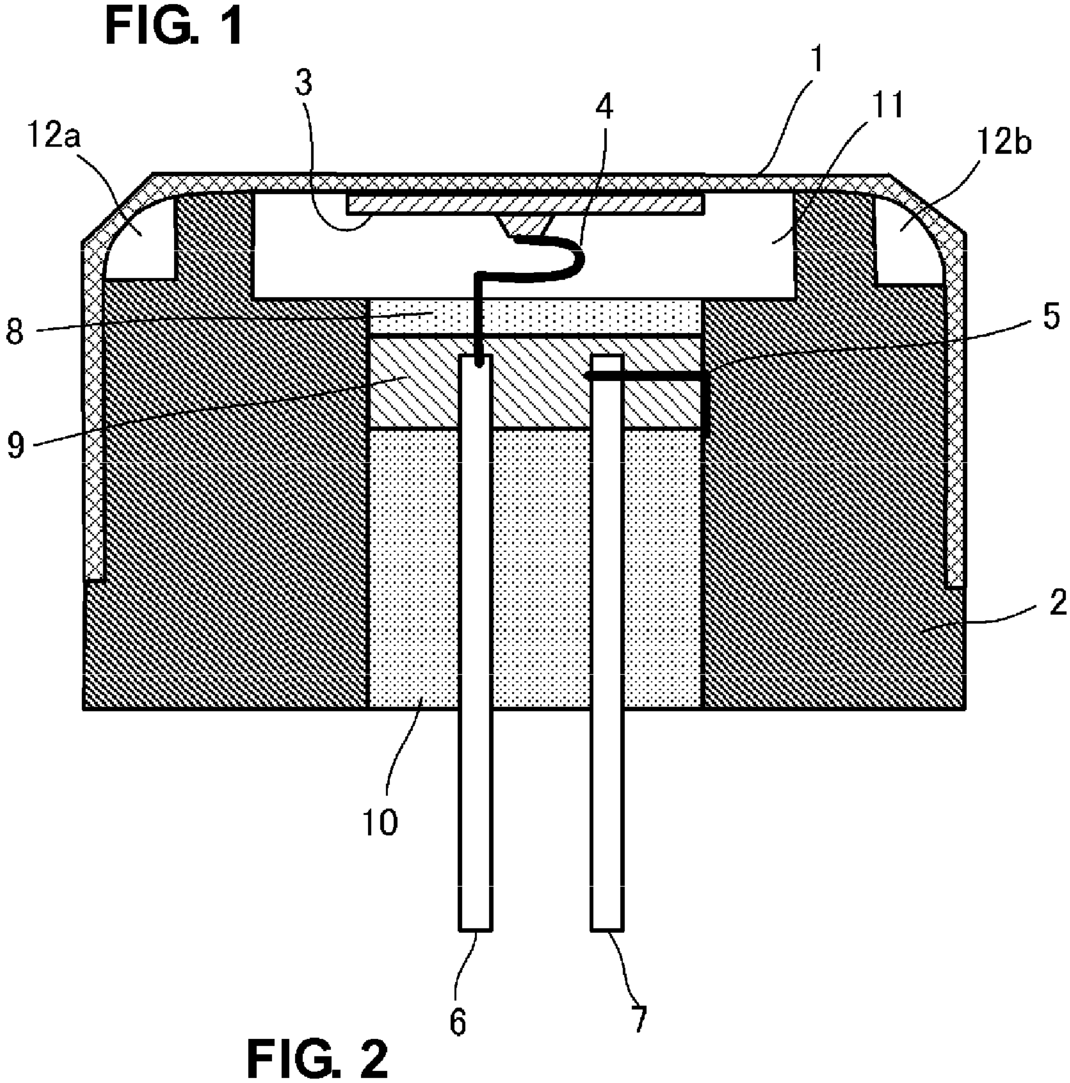
FIG. 1 is a sectional view illustrating an ultrasonic transducer according to a first preferred embodiment of the present invention.
Figure 2:
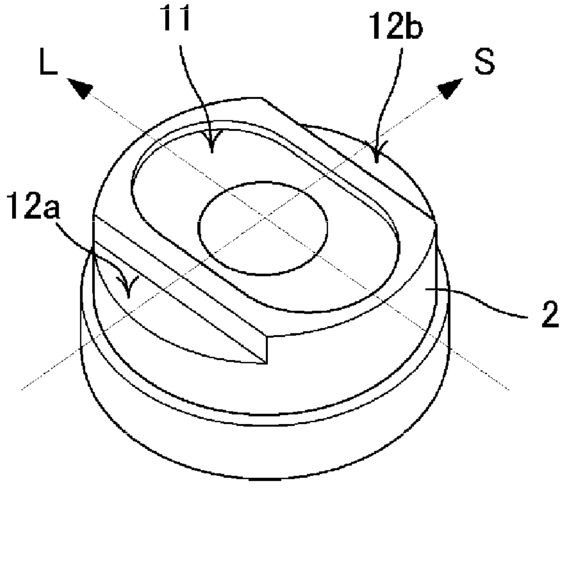
FIG. 2 is a perspective view of an inner case provided in the ultrasonic transducer according to the first preferred embodiment of the present invention.

FIG. 1 is a sectional view of principal portion of an ultrasonic transducer according to a first preferred embodiment of the present invention, and FIG. 2 is a perspective view of an inner case, viewed from the upper surface side. The ultrasonic transducer preferably includes a case including two members, i.e., an outer case 1 and an inner case 2, which are connected to each other. The outer case 1 is preferably made of, e.g., aluminum, and a piezoelectric device 3 having a substantially circular disk shape is connected to an inner bottom surface of the outer case 1. The piezoelectric device 3 includes electrodes provided on both surfaces thereof, and one of the electrodes is electrically conductive with the outer case 1.

The inner case 2 is preferably made of a material, e.g., zinc, having a medium density greater than the outer case 1. A first cutout 11 having a substantially elongated circular shape and second cutouts 12*a* and 12*b* spaced away from the first cutout 11 are provided in a surface of the inner case 2, which is arranged to face an inner bottom surface of the outer case 1.

A through-hole is preferably arranged to penetrate a central portion of the inner case 2, and metal pins 6 and 7 extend outward from the through-hole. A sound absorber 8, a pin support base plate 9, and a filler 10 are preferably successively arranged in the through-hole in this order from a side closer to the bottom surface of the outer case 1. The electrode provided on the surface of the piezoelectric device 3 closer to the inner case 2 and one end of the pin 6 are preferably connected to each other via a wire 4. One end of the other pin 7 and the inner case 2 are preferably connected to each other via a wire 5. The respective other ends of the pins 6 and 7 extend out to the exterior of the inner case 2 after passing through the through-hole of the inner case 2.

As illustrated in FIG. 2, the second cutouts 12*a* and 12*b* are arranged in the ultrasonic vibration acting surface of the inner case 2, i.e., an upper surface thereof as viewed in FIG. 2, in a line symmetrical relationship with a long axis of the first cutout 11 being a symmetrical axis. Due to the second cutouts 12*a* and 12*b* in addition to the first cutout, a distribution of the mass acting to restrain the outer case 1 is substantially uniform so as to suppress undesired vibrations in the bending mode. The suppression of the undesired vibrations will be described in detail below.

The undesired vibrations are presumably generated due to the fact that, in the ultrasonic vibration acting surface of the inner case 2 which is in contact with the inner bottom surface of the outer case 1, the restraint mass is unbalanced between a long-axis direction of an effective vibration region, which is provided by the piezoelectric device 3 and the outer case 1, and a short-axis direction substantially perpendicular to the long-axis direction. Herein, the effective vibration region corresponds to a portion of the bottom surface of the outer case 1 to which the piezoelectric device is connected and the first cutout in the ultrasonic vibration acting surface of the inner case 2 is arranged in a confronting relationship. Furthermore, a long-axis direction L of the effective vibration region corresponds to the long-axis direction of the first cutout 11, and a short-axis direction S of the effective vibration region corresponds to the direction substantially perpendicular to the long-axis direction of the first cutout 11.

The mechanism which produces the undesired vibrations is believed to be as follows. When the piezoelectric device 3 vibrates and displaces the bottom surface of the outer case 1, the vibratory displacements are restrained by the mass applied from the ultrasonic vibration acting surface of the inner case 2 arranged so as to be in contact with the outer case 1. More specifically, in the short-axis direction S of the first cutout, because a portion of the ultrasonic vibration acting surface of the inner case 2 in contact with the inner bottom surface of the outer case 1 is larger, a larger restraint mass is applied to the bottom surface of the outer case 1 and the bottom surface that functions as a vibrating surface is entirely restrained. Therefore, it is more difficult for the vibration energy to propagate in the short-axis direction S of the first cutout 11. On the other hand, in the long-axis direction L of the first cutout, because the portion of the ultrasonic vibration acting surface of the inner case 2 in contact with the inner bottom surface of the outer case 1 is smaller, a smaller restraint mass than that in the short-axis direction S of the first cutout is applied to the bottom surface of the outer case 1. Therefore, vibration energy is concentrated in the long-axis direction L of the first cutout and propagates more easily in the long-axis direction L of the first cutout. As a result, a difference in vibration energy occurs between the long-axis direction L and the short-axis direction S of the first cutout, thus causing anisotropy. In other words, a difference in the propagated vibration energy between the long-axis direction L and the short-axis direction S of the first cutout in the effective vibration region and a difference in the restraint mass restraining the bottom surface of the outer case 1 from the ultrasonic vibration acting surface of the inner case 2 therebetween cause excitation in a bending mode in which the effective vibration region is alternately distorted between the long-axis direction L and the short-axis direction S.

Due to the above-described mechanism, as illustrated in FIG. 2, the second cutouts 12*a* and 12*b* are arranged in the ultrasonic vibration acting surface of the inner case 2 in a line symmetrical relation with the long axis of the first cutout 11 being a symmetrical axis. Due to the second cutouts 12*a* and 12*b* in addition to the first cutout, a distribution of the restraint mass which restrains the outer case 1 is substantially uniform between the long-axis direction L and the short-axis direction S of the first cutout so that the undesired vibrations in the bending mode are effectively suppressed while the anisotropy is maintained.

Furthermore, in the present preferred embodiment, the inner case 2 has a medium density that is greater than the outer case 1. Generally, the vibration of the piezoelectric device connected to the bottom surface of the outer case 1 is transmitted to a side surface of the outer case 1, which generates a reverberation. By connecting the inner case 2, which has a medium density greater than the outer case 1, to the outer case 1 from the inner side as in the present preferred embodiment, it is possible to suppress the vibration of the side surface of the outer case 1 from the inner side of the outer case 1, and to suppress the resonance vibration of the side surface of the outer case 1.

Second Preferred Embodiment

Figure 3A:
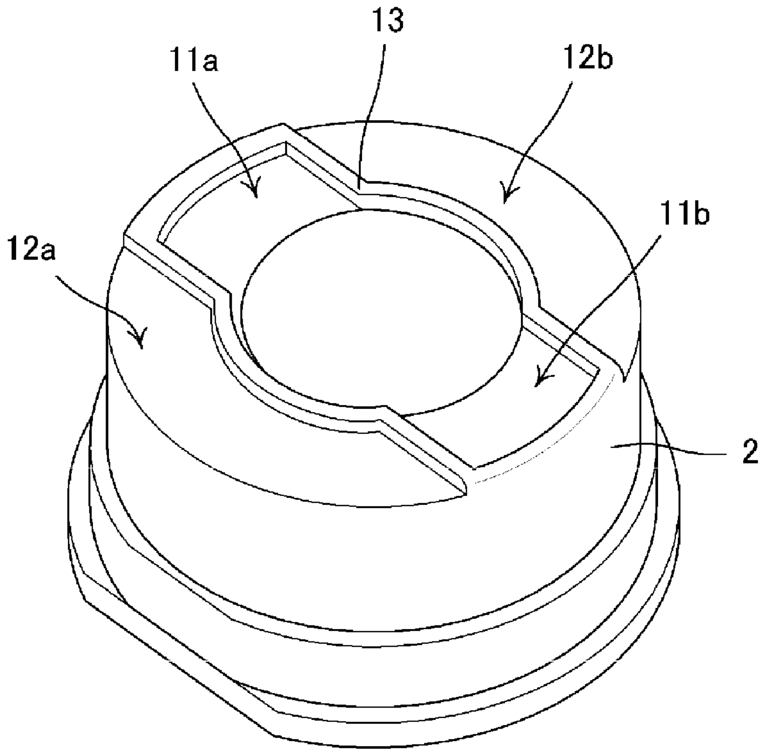
FIGS. 3A and 3B include a perspective view of an inner case provided in an ultrasonic transducer according to a second preferred embodiment of the present invention and a perspective view of an inner case used in an ultrasonic transducer as a comparative example.
Figure 3B:
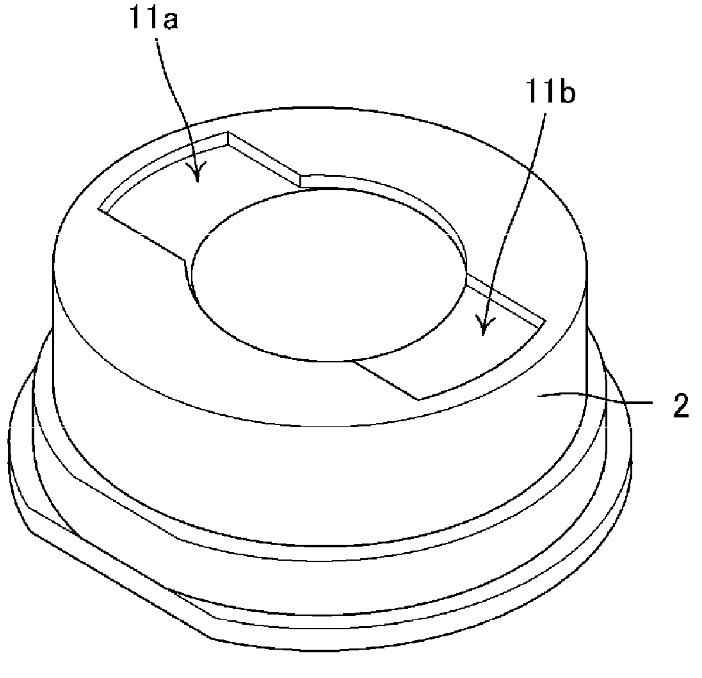

FIGS. 3A and 3B illustrate the shape of an inner case provided in an ultrasonic transducer according to a second preferred embodiment of the present invention. FIG. 3A is a perspective view of the inner case provided in the ultrasonic transducer according to the second preferred embodiment, viewed from the ultrasonic vibration acting surface side, and FIG. 3B is a perspective view of an inner case provided in an ultrasonic transducer as a comparative example.

In the second preferred embodiment, first cutouts 11*a* and 11*b* and second cutouts 12*a* and 12*b* are provided in an ultrasonic vibration acting surface of an inner case 2. More specifically, the second preferred embodiment differs from the first preferred embodiment in that the first cutout provided to flatten an ultrasonic beam includes separate cutouts at locations approximately 180° opposite to each other with a central through-hole of the inner case located between the separate first cutouts. Furthermore, by providing the second cutouts 12*a* and 12*b*, raised portions 13 are provided around the first cutouts 11*a* and 11*b* and around the through-hole. The second cutouts 12*a* and 12*b* are defined by entire or substantially entire portions of the ultrasonic vibration acting surface outside the raised portions 13.

Figure 4A:
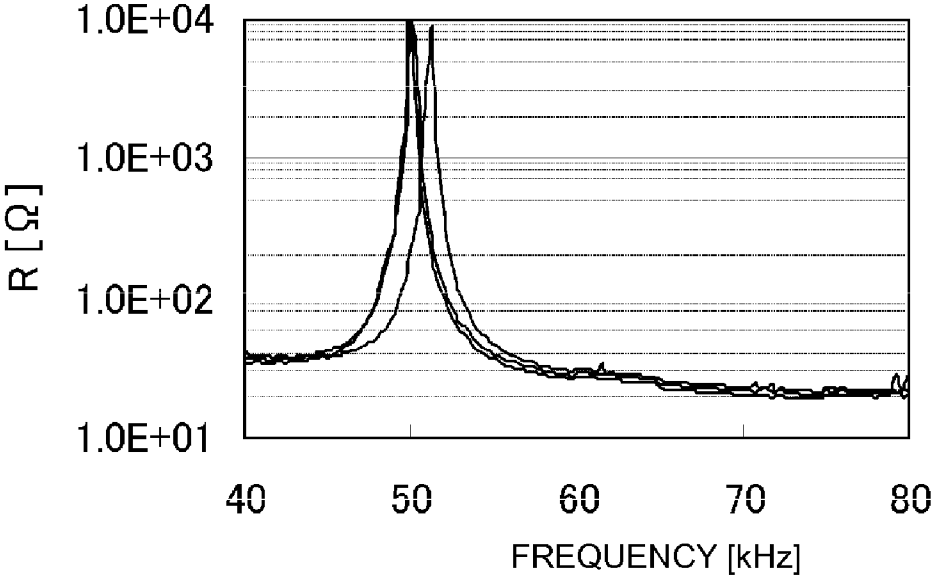
FIGS. 4A and 4B are charts illustrating an impedance characteristic with respect to frequency of the ultrasonic transducer provided with the inner cases illustrated in FIGS. 3A and 3B.
Figure 4B:
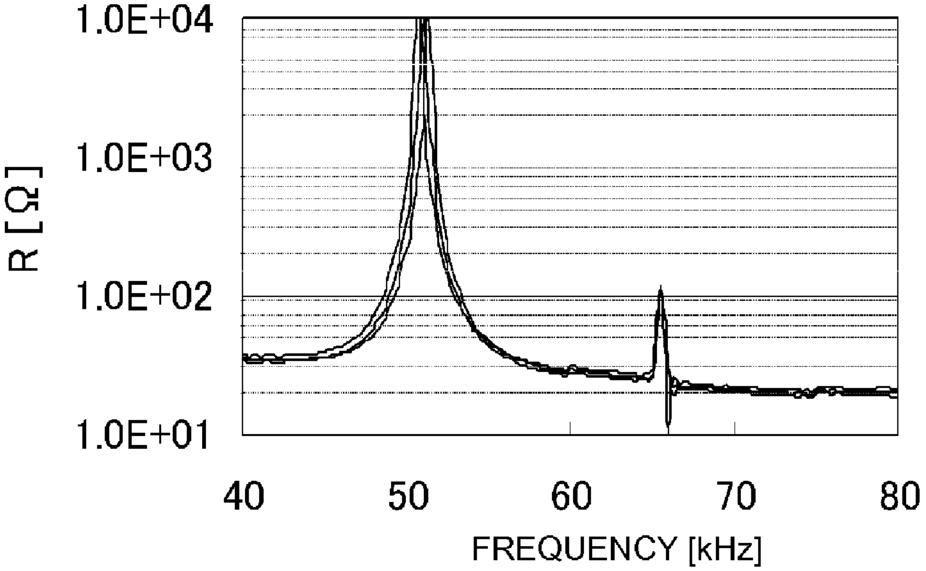

FIGS. 4A and 4B are charts plotting a waveform of impedance with respect to frequency of the ultrasonic transducer provided with the inner case illustrated in FIGS. 3A and 3B. The charts plot the waveforms for three samples. The impedance is measured in accordance with the R-X method (Z=R+jX). Herein, impedance R is a real portion of an impedance characteristic |Z| of a sensor and corresponds to an antiresonance point in |Z|. The presence of the antiresonance point indicates that there is a vibration mode near the relevant frequency. Thus, it is preferable that the impedance R has no peaks other than the basic vibration.

FIG. 4A represents an impedance characteristic when the inner case illustrated in FIG. 3A is provided, and FIG. 4B represents an impedance characteristic when the inner case illustrated in FIG. 3B is used. In each of FIGS. 4A and 4B, a large peak in the vicinity of about 50 kHz indicates a basic vibration mode. However, in FIG. 4B, a small peak also occurs in the vicinity of about 65 kHz. Thus, it is understood that an undesired vibration mode occurs due to the bending mode. On the other hand, the undesired vibration mode does not occur in FIG. 4A, which represents the second preferred embodiment of the present invention.

If the undesired vibration mode occurs near the basic frequency as illustrated in FIG. 4B, the undesired vibration also tend to be excited when the ultrasonic transducer is driven at the basic vibration, thus resulting in deterioration of a reverberation characteristic. The undesired vibration is effectively suppressed by providing the second cutouts 12*a* and 12*b* as illustrated in FIG. 3A.

Figure 5A:
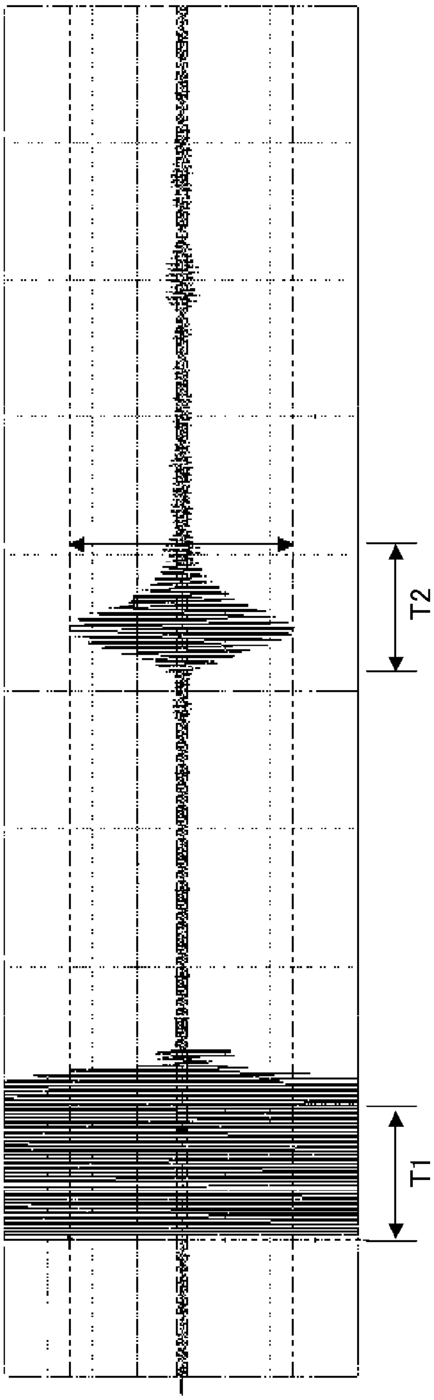
FIGS. 5A and 5B are charts illustrating a reverberation characteristic of the ultrasonic transducer provided with the inner cases illustrated in FIGS. 3A and 3B.
Figure 5B:
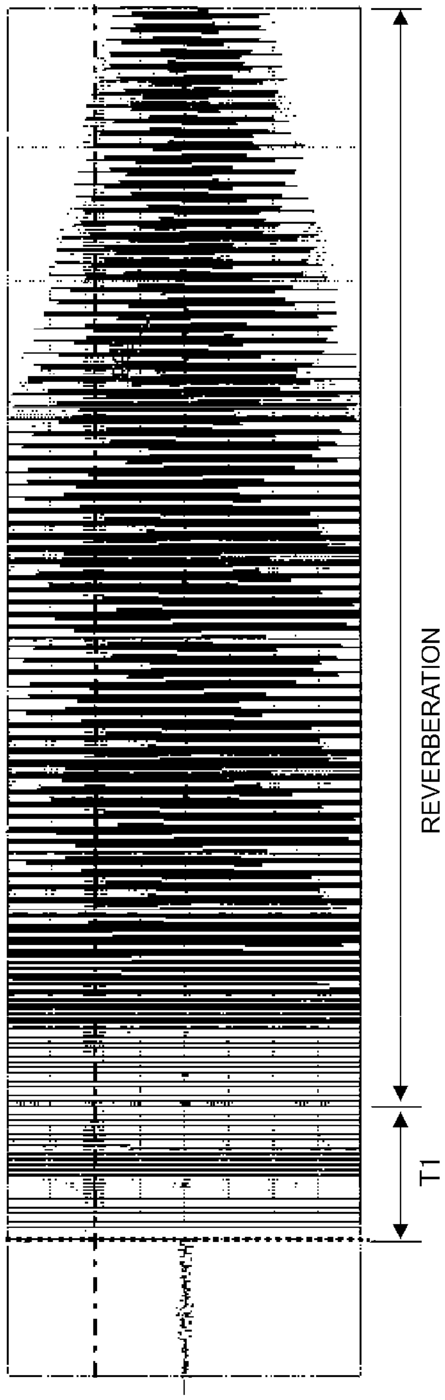

FIGS. 5A and 5B illustrate the results of measuring reverberation characteristics of the above-described two ultrasonic transducers. More specifically, FIG. 5A illustrates the characteristic of the ultrasonic transducer according to the second preferred embodiment, and FIG. 5B illustrates the characteristic of the ultrasonic transducer as the comparative example. A T1 period on the left side of FIG. 5A represents transmitted waves, i.e., a driving period, and a subsequent T2 period represents vibrations caused by reflected waves. One unit in the horizontal axis corresponds to about 0.1 ms. If the reverberation continues for a relatively long time after the end of the driving period as illustrated in FIG. 5B, the reflected waves cannot be detected at all. In the second preferred embodiment, since the damping material used in the related art to prevent the undesired vibrations is not coated, transmission/reception sensitivity can be obtained with an improved characteristic.

It is noted that the shapes of the second cutouts are not limited to those illustrated in the first and second preferred embodiments, and the second cutouts may preferably have, for example, notched, engraved, or tapered shapes.

Third Preferred Embodiment

Figure 6:
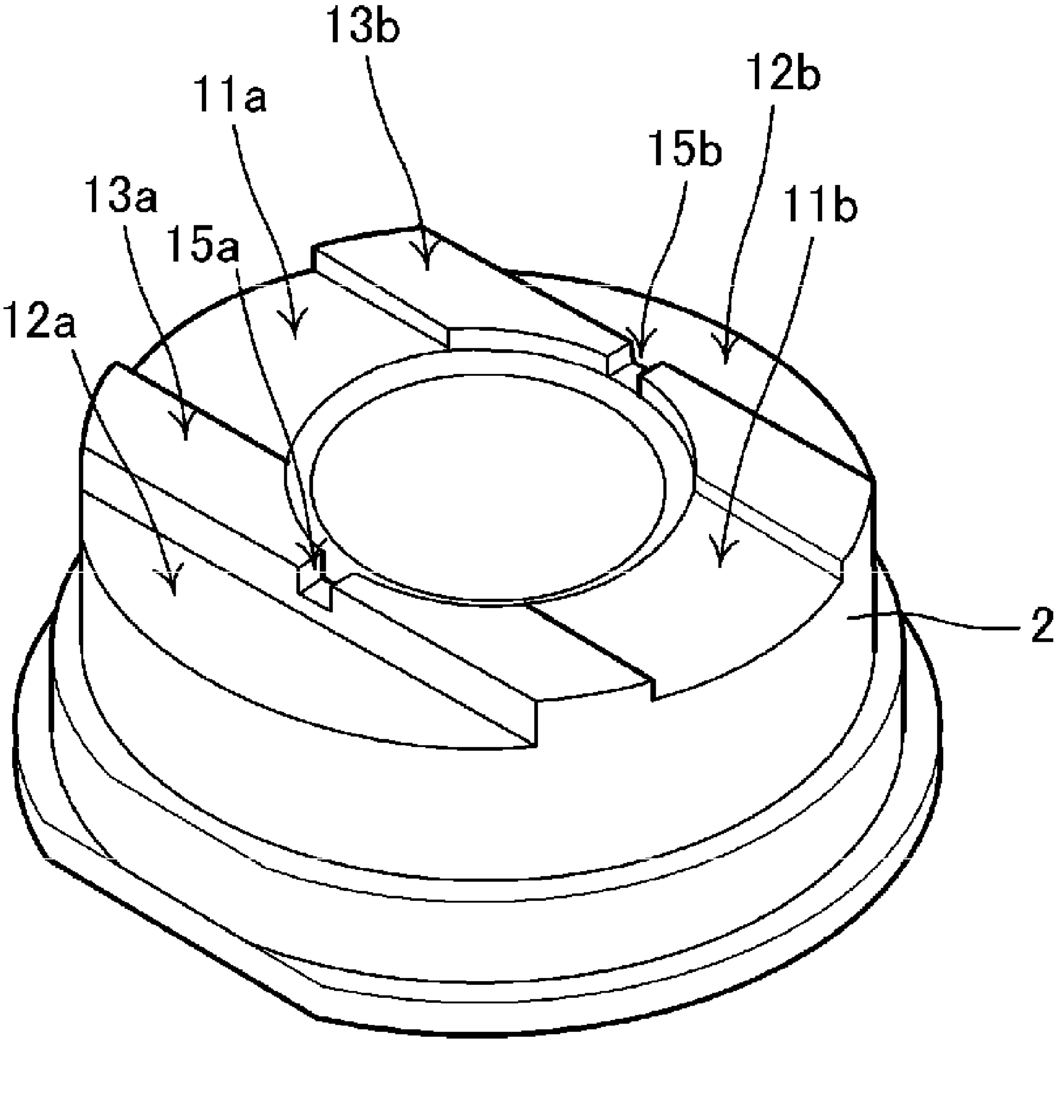
FIG. 6 is a perspective view of an inner case used in an ultrasonic transducer according to a third preferred embodiment of the present invention.

FIG. 6 illustrates the shape of an inner case provided in an ultrasonic transducer according to a third preferred embodiment of the present invention.

In the third preferred embodiment, first cutouts 11*a* and 11*b* and second cutouts 12*a* and 12*b* are provided in an ultrasonic vibration acting surface of an inner case 2. More specifically, the third preferred embodiment differs from the second preferred embodiment in that opposite outer ends of the first cutouts in the long-axis direction extend to corresponding edges of the ultrasonic vibration acting surface of the inner case 2. Furthermore, third cutouts 15*a* and 15*b* are provided in a central portion of the raised portions 13*a* and 13*b* in the lengthwise direction thereof, which are arranged between the first cutouts 11*a*, 11*b* and the second cutouts 12*a*, 12*b*, respectively.

Figure 7D:
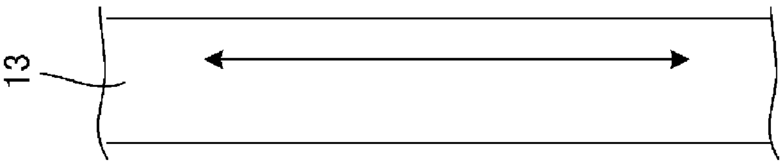
FIGS. 7A to 7D illustrate vibration modes in an inner bottom surface of an outer case in the ultrasonic transducer according to the third preferred embodiment of the present invention and vibration modes in the inner bottom surface of the outer case in the comparative ultrasonic transducer.
Figure 7C:
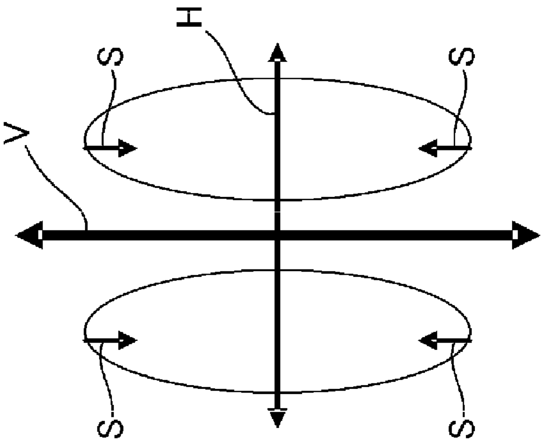
Figure 7B:
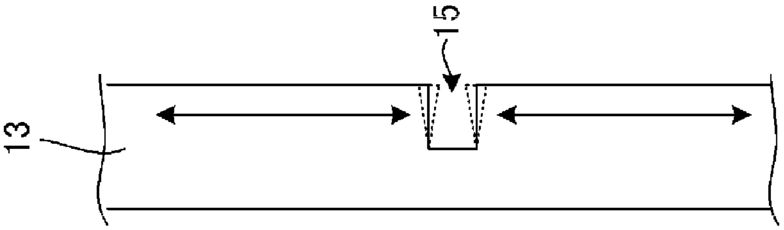
Figure 7A:
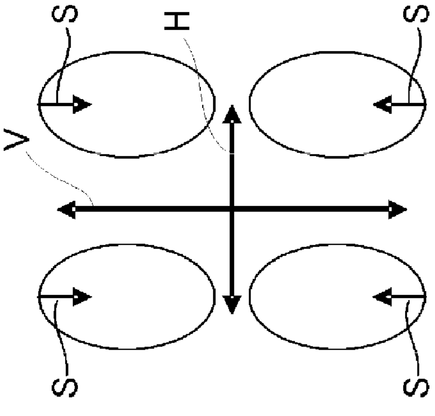

FIGS. 7A to 7D illustrate vibration modes in an inner bottom surface of an outer case in the ultrasonic transducer according to the third preferred embodiment and vibration modes in the inner bottom surface of the outer case in the comparative ultrasonic transducer. More specifically, FIG. 7A illustrates vibration modes in the inner bottom surface of the outer case in the ultrasonic transducer provided with the inner case illustrated in FIG. 6. FIG. 7C illustrates vibration modes in the inner bottom surface of the outer case in the ultrasonic transducer provided with the inner case illustrated in FIG. 3A, i.e., the ultrasonic transducer according to the second preferred embodiment. Furthermore, FIGS. 7B and 7D are illustrations to explain the operating effect of the third cutout 15 (15*a* and 15*b*) provided in the raised portion 13 (13*a* and 13*b*).

In FIGS. 7A and 7C, a zone indicated by each ellipse represents an approximate location at which the ultrasonic vibration acting surface of the inner case abuts against the inner bottom surface of the outer case, and arrows S, H and V represent vibrating directions of respective spurious modes.

If there is a spurious mode vibrating in the direction denoted by an arrow S in FIG. 7C, the spurious vibration vibrates to a large extent in the direction of an arrow H because a path allowing the vibration to escape therethrough is not provided at a central portion of the raised portion 13. Furthermore, vibration in the direction of an arrow V is also increased. Vibration modes in the directions of the arrows H and V are bending modes and cause various spurious modes.

In contrast, when the third cutout 15 is provided in the raised portion 13 as illustrated in FIGS. 7A and 7B, the vibration is absorbed at the third cutout 15 provided in the raised portion 13 as illustrated in FIG. 7B. Specifically, compressive/tensile stresses in the lengthwise direction escaped through the third cutout 15. Therefore, the vibrations in the directions of the arrows H and V are not significantly increased, and the spurious vibration are reduced.

Although one third cutout 15*a* and 15*b* is preferably provided in each of the raised portion portions 13*a* and 13*b* in third preferred embodiment illustrated in FIG. 6, a plurality of third cutouts may preferably be provided in each of the raised portions 13*a* and 13*b*.

The third cutouts 15*a* and 15*b* preferably have shapes produced by cutting the raised portions 13*a* and 13*b* in directions perpendicular or substantially perpendicular to long axes of the raised portions 13*a* and 13*b*. Preferably, the third cutout is provided at a central location of the raised portion in the lengthwise direction thereof or at each of symmetrical locations with respect to the central location of the raised portion. The reason for this is that such an arrangement of the third cutouts ensures mass balance about the central portion of the ultrasonic vibration acting surface of the inner case, which is arranged to face the inner bottom surface of the outer case, i.e., a vibrating surface thereof.

Figure 8A:
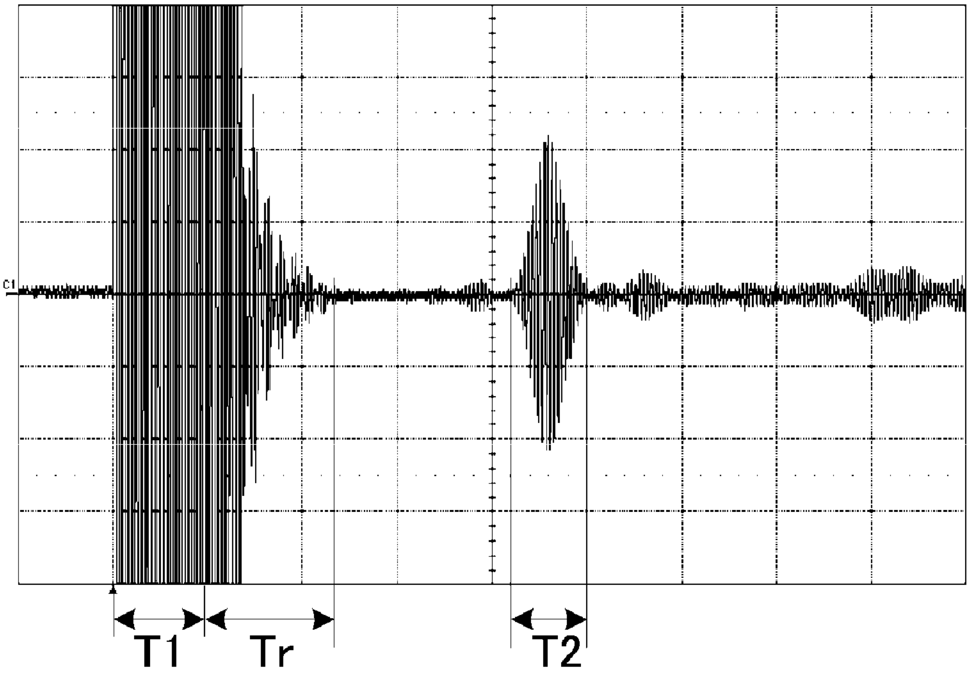
FIGS. 8A and 8B illustrate a reverberation characteristic of the ultrasonic transducer according to the third preferred embodiment of the present invention and a reverberation characteristic of the comparative ultrasonic transducer.
Figure 8B:
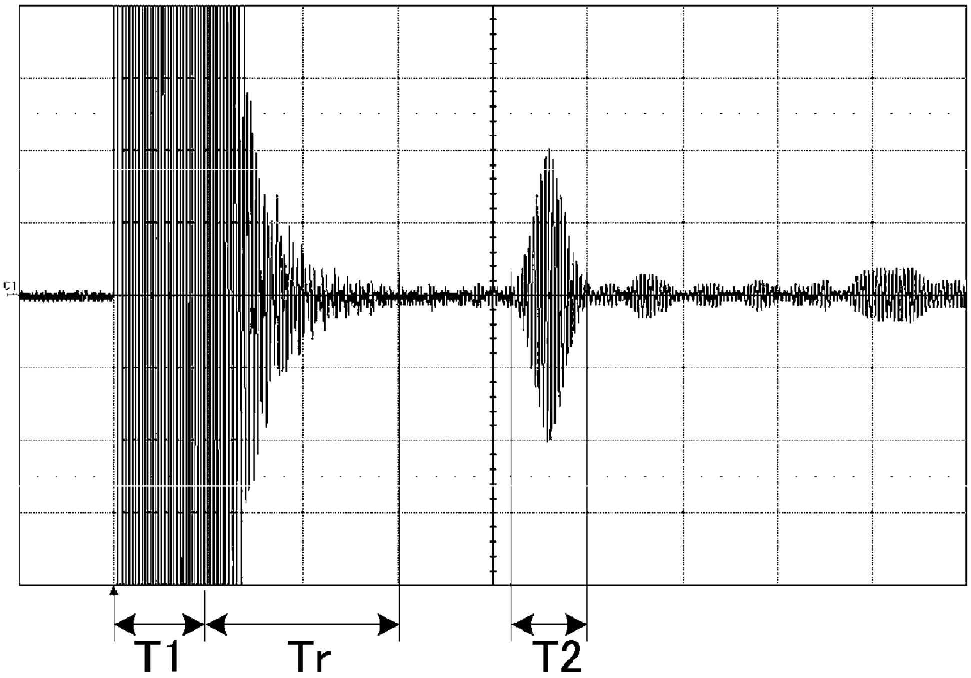

FIG. 8A is a chart illustrating a reverberation characteristic of the ultrasonic transducer according to the third preferred embodiment, and FIG. 8B is a chart illustrating a reverberation characteristic of the ultrasonic transducer provided with the inner case illustrated in FIG. 3A.

In FIGS. 8A and 8B, a T1 period on the left side represents transmitted waves, i.e., a driving period, and a Tr period that continues from the T1 period represents vibrations caused by reflected waves. One unit in the horizontal axis corresponds to about 0.1 ms. As will be seen, a reverberation time Tr in FIG. 8A is comparable to a reverberation time Tr in FIG. 8B. This indicates that the ultrasonic transducer including the third cutouts 15*a* and 15*b* provided in the raised portions can suppress the reverberation to a similar extent as the ultrasonic transducer corresponding to FIG. 8B.

Figure 9A:
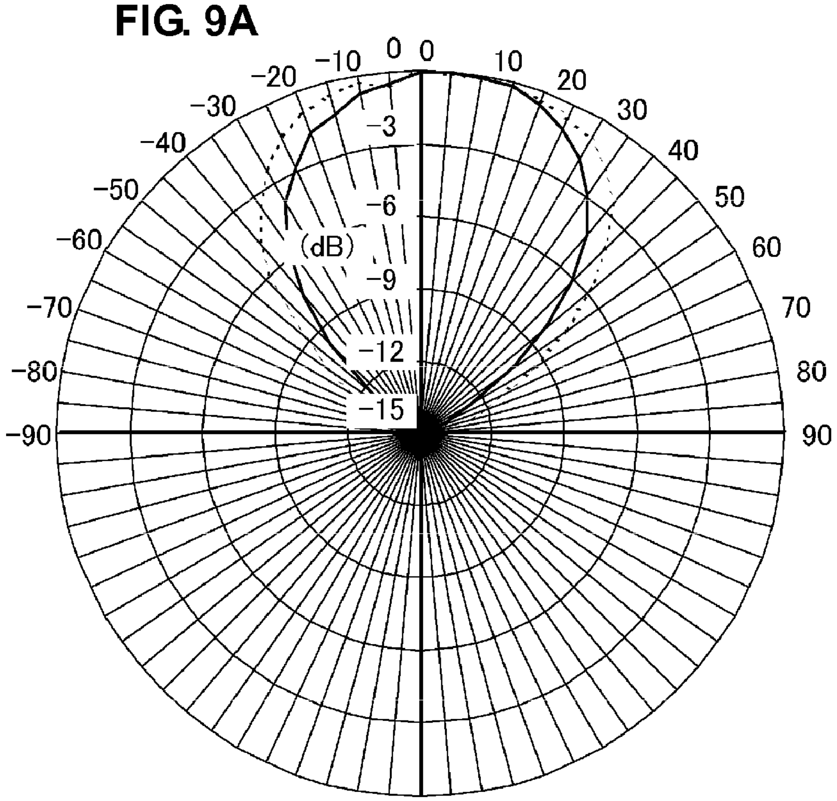
FIGS. 9A and 9B illustrate a directivity characteristic of the ultrasonic transducer according to the third preferred embodiment of the present invention and a directivity characteristic of the comparative ultrasonic transducer.
Figure 9B:
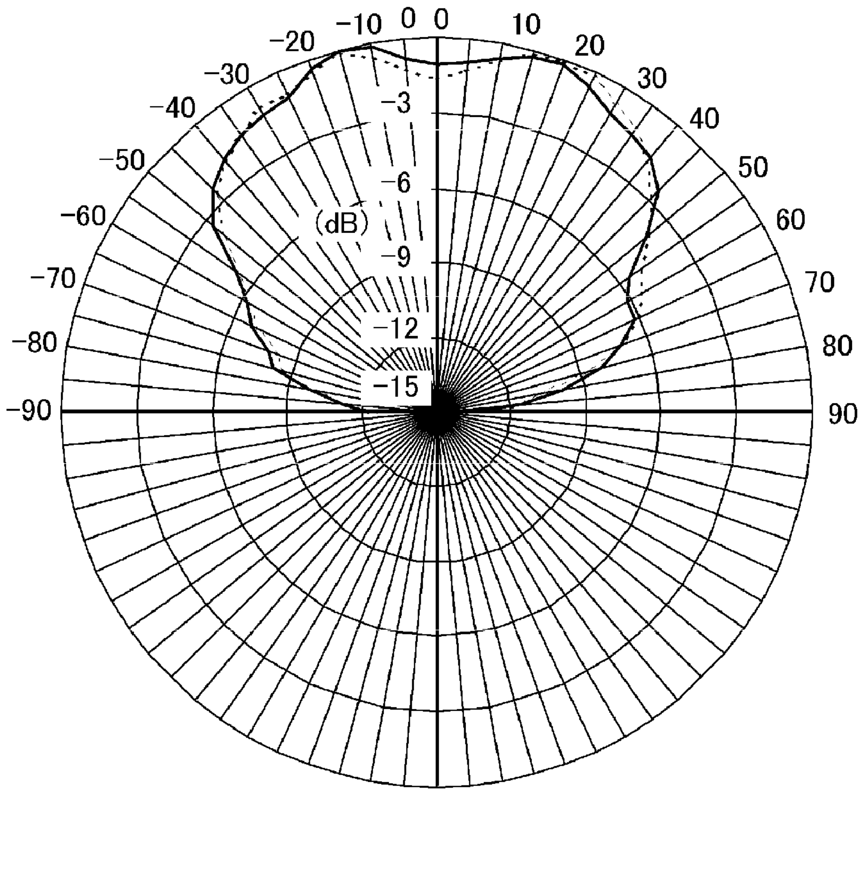

FIGS. 9A and 9B illustrate a directivity characteristic of sound pressure in the ultrasonic transducer according to the third preferred embodiment and a directivity characteristic of sound pressure in the comparative ultrasonic transducer provided with the inner case illustrated in FIG. 3A. More specifically, FIG. 9A represents a sound pressure characteristic in the vertical direction. In FIG. 9A, −90 degrees and +90 degrees correspond to the long-axis direction of the first cutout. FIG. 9B represents a sound pressure characteristic in the horizontal direction. In FIG. 9B, −90 degrees and +90 degrees correspond to the short-axis direction of the first cutout.

Further, in FIGS. 9A and 9B, a solid line represents the characteristic of the ultrasonic transducer according to the third preferred embodiment, and a broken line represents the characteristic of the ultrasonic transducer provided with the inner case illustrated in FIG. 3A.

As will be seen, the ultrasonic transducer according to the third preferred embodiment improves the directivity due to the structure in which the outer opposite ends of the first cutouts in the long-axis direction extend to the corresponding case edges.

According to the ultrasonic transducer according to the third preferred embodiment, as described above, the ultrasonic beam can be further flattened while the reverberation is suppressed.

Fourth Preferred Embodiment

In the first and second preferred embodiments, the second cutouts are defined by spaces each including an air medium similar to the first cutout. However, in a fourth preferred embodiment, a filler preferably having a medium density less than those of the outer case 1 and the inner case 2 is filled in the space defined by the second cutout.

Figure 10:
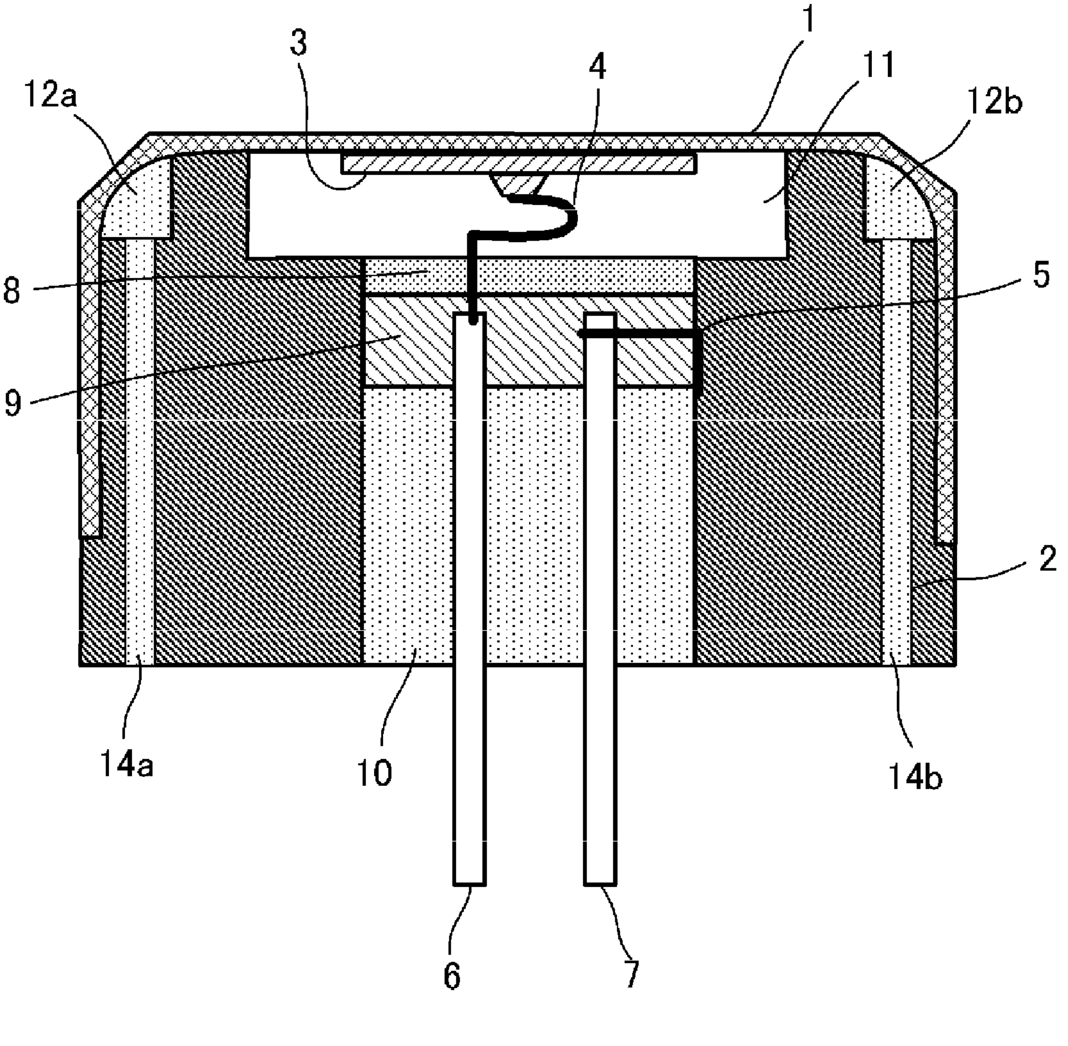
FIG. 10 is a sectional view illustrating a construction of an ultrasonic transducer according to a fourth preferred embodiment of the present invention.

FIG. 10 is a sectional view of an ultrasonic transducer according to a fourth preferred embodiment. The inner case 2 includes through-holes 14*a* and 14*b* that penetrate the inner case 2 and communicate with the second cutouts 12*a* and 12*b*, respectively. The filler is poured into the second cutouts 12*a* and 12*b* via the through-holes 14*a* and 14*b* from the backside of the inner case 2. The filler absorbs undesired vibrations which occur at corners of the inner bottom surface of the outer case 1 and in the side surface of the outer case 1, and further reduces adverse influences of the undesired vibration modes.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An ultrasonic transducer comprising:

an outer case having a tubular shape including a bottom;

a piezoelectric device attached to an inner bottom surface of the outer case;

an inner case disposed within the outer case and having a surface arranged to face the inner bottom surface of the outer case so as to define an ultrasonic vibration acting surface arranged such that a mass of the inner case is arranged to restrain vibration of the outer case, the vibration being generated by the piezoelectric device; and terminals electrically connected to the piezoelectric device; wherein the inner case includes a first cutout provided in a portion of the ultrasonic vibration acting surface, the first cutout being arranged to face the piezoelectric device and to flatten an ultrasonic beam generated by vibrations of the piezoelectric device and the outer case; and the inner case includes at least two second cutouts provided in portion of the ultrasonic vibration acting surface that are spaced away from the first cutout.

2. The ultrasonic transducer according to claim 1, wherein the first cutout has a shape having a long axis extending in one direction along the surface of the inner case which is arranged to face the inner bottom surface of the outer case, and the at least two second cutouts are arranged in a line symmetrical relationship with the long axis of the first cutout defining a symmetrical axis.

3. The ultrasonic transducer according to claim 1, wherein the at least two second cutouts define a raised portion arranged around the first cutout, and the at least two second cutouts are arranged along substantially an entire surface of the ultrasonic vibration acting surface outside the raised portion.

4. The ultrasonic transducer according to claim 1, wherein the inner case has a medium density greater than that of the outer case.

5. The ultrasonic transducer according to claim 1, wherein a filler is disposed to fill a space defined by the at least two second cutouts of the inner case and the inner bottom surface of the outer case, and the filler has a medium density less than those of the inner case and the outer case.

6. The ultrasonic transducer according to claim 5, wherein a through-hole is arranged to communicate with the at least two second cutouts.

7. The ultrasonic transducer according to claim 3, wherein outer opposite ends of the first cutout in a long-axis direction thereof extend to corresponding edges of the inner case, and a third cutout is provided in a central portion of the raised portion in a lengthwise direction thereof.

* * * * *